(12) United States Patent
Zhou et al.

(10) Patent No.: US 10,023,068 B2
(45) Date of Patent: Jul. 17, 2018

(54) SYSTEMS AND METHODS FOR BATTERY USAGE REGULATION FOR BATTERY LIFE PROTECTION

(71) Applicant: Cummins, Inc., Columbus, IN (US)

(72) Inventors: Lining Zhou, Columbus, IN (US); Martin T. Books, Columbus, IN (US)

(73) Assignee: Cummins, Inc., Columbus, IN (US)

( * ) Notice: Subject to any disclaimer, the term of this patent is extended or adjusted under 35 U.S.C. 154(b) by 159 days.

(21) Appl. No.: 14/881,781

(22) Filed: Oct. 13, 2015

(65) Prior Publication Data

US 2017/0101027 A1 Apr. 13, 2017

(51) Int. Cl.
- *H02J 7/00* (2006.01)
- *B60L 11/18* (2006.01)
- *G01R 31/36* (2006.01)

(52) U.S. Cl.
CPC ....... *B60L 11/1862* (2013.01); *B60L 11/1857* (2013.01); *G01R 31/3675* (2013.01); *G01R 31/3693* (2013.01)

(58) Field of Classification Search
CPC . B60L 11/1862; B60L 11/1857; H01M 10/48; H01M 10/4257; G01R 31/3675; G01R 31/3693; G01R 31/3648; G01R 31/3651; G01R 31/3624; Y02E 60/12; H02J 7/0004; H02J 7/006; H02J 7/0047; H02J 7/0031; H02J 2007/004; H02J 2007/0037; H02J 7/0073; H02J 7/0078; H02J 7/0093
USPC .......................................... 320/106, 132–134
See application file for complete search history.

(56) References Cited

U.S. PATENT DOCUMENTS

| | | | |
|---|---|---|---|
| 6,222,345 B1 | 4/2001 | Yamanashi | |
| 7,078,877 B2 | 7/2006 | Salasoo et al. | |
| 7,267,191 B2 | 9/2007 | Xu et al. | |
| 7,449,891 B2 | 11/2008 | Cawthorne | |
| 7,538,520 B2 | 5/2009 | Zettel et al. | |
| 7,638,980 B2 | 12/2009 | Zettel et al. | |
| 7,932,699 B2 | 4/2011 | Nam et al. | |
| 7,983,862 B2 | 7/2011 | Zhang | |
| 2005/0206388 A1* | 9/2005 | Quint | H01M 10/42 324/430 |
| 2007/0029974 A1* | 2/2007 | Uchida | G01R 31/3624 320/132 |
| 2009/0088914 A1* | 4/2009 | Mizutani | B60K 1/02 701/22 |
| 2011/0082621 A1* | 4/2011 | Berkobin | B60L 11/1824 701/31.4 |
| 2011/0111799 A1* | 5/2011 | Kothari | H04W 52/0261 455/556.2 |
| 2011/0127958 A1 | 6/2011 | Ishishita et al. | |
| 2012/0175953 A1 | 7/2012 | Ohkawa et al. | |
| 2013/0262067 A1* | 10/2013 | Zhang | G01R 31/3651 703/8 |

(Continued)

Primary Examiner — Yalkew Fantu
Assistant Examiner — Mohammed J Sharief
(74) Attorney, Agent, or Firm — Foley & Lardner LLP (57) ABSTRACT

Methods, systems, and apparatus of managing the lifespan of a battery are disclosed herein. A method comprises interpreting age data indicative of a current age of a battery, interpreting usage data indicative of a current usage of the battery, comparing the age data to the usage data, and allocating a propelling power from the battery in a hybrid electric vehicle (HEV) responsive to the comparison.

17 Claims, 3 Drawing Sheets

(56) References Cited

U.S. PATENT DOCUMENTS

| | | | | |
|---|---|---|---|---|
| 2014/0217958 A1* | 8/2014 | Verdun | .................. | H02J 7/007 320/107 |
| 2015/0306971 A1* | 10/2015 | Chang | ................. | B60L 11/1862 701/22 |
| 2016/0039295 A1* | 2/2016 | Madurai-Kumar | ... | B60L 11/184 320/109 |

* cited by examiner

SYSTEMS AND METHODS FOR BATTERY USAGE REGULATION FOR BATTERY LIFE PROTECTION

TECHNICAL FIELD

The present disclosure relates generally to batteries. More particularly, the present disclosure relates to management of the lifespan of batteries in a hybrid electric vehicle (HEV).

BACKGROUND

A HEV uses a battery pack to supply electrical energy to an electric motor or an electric machine, which are operable to provide motive torque, in combination with, for example, an internal combustion engine. Given the dynamics associated with operation of a HEV, particularly the constant flow of power into and out of the battery, the battery plays a critical role in the operation of the HEV. Generally the battery has a limited life expectancy of usage before not satisfying specific performance criteria. The life expectancy might be specified in a manufacturer's warranty in terms of, for example, a period of time since the battery began use in the HEV and/or a mileage that the battery has travelled with the HEV before the battery underperforms. It is important for the lifespan of the battery to meet the manufacturer's warranty and customers' expectations.

SUMMARY OF THE INVENTION

One embodiment relates to an apparatus comprising an age data module structured to interpret age data indicative of a current age of a battery, a usage data module structured to interpret usage data indicative of a current usage of the battery, a comparison module structured to compare the age data to the usage data, and an allocation module structured to allocate a propelling power from the battery in a vehicle responsive to the comparison.

Another embodiment relates to a system comprising a battery, a battery monitor coupled to the battery, and a controller communicably coupled to the battery and the battery monitor. The controller is structured to interpret age data indicative of a current age of the battery received from the battery monitor, to interpret usage data indicative of a current usage of the battery received from the battery monitor, to compare the age data to the usage data, and to allocate a propelling power from the battery in a vehicle responsive to the comparison.

Still another embodiment relates to a method comprising interpreting age data indicative of a current age of a battery, interpreting usage data indicative of a current usage of the battery, comparing the age data to the usage data, and allocating a propelling power from the battery in a vehicle responsive to the comparison.

These and other features, together with the organization and manner of operation thereof, will become apparent from the following detailed description when taken in conjunction with the accompanying drawings.

DETAILED DESCRIPTION

Referring to the figures generally, the various embodiments disclosed herein relate to methods, systems, and apparatus of managing the lifespan of a battery. More particularly, the present disclosure provides for a method of regulating the usage of a battery (e.g., high-voltage lithium-ion battery) to prevent potential over usage. The method compares two sets of data. The first set of data is indicative of a current age of a battery of a HEV, for example, a period of time since the battery began use in the HEV, or a distance that the battery has travelled with the HEV, or a combination of both. The second set of data is indicative of a current usage of the battery, for example, a current cumulative throughput of the battery, or a current state of health (SOH) of the battery, or a combination of both. The method determines a first percentage of the current age in a target life expectancy of the battery (e.g., the life expectancy specified in a manufacturer's warranty) and a second percentage of the current usage in a target end-of-life total usage of the battery (e.g., the end-of-life total throughput). The method then compares the first percentage to the second percentage (e.g., determine the difference or ratio of the first percentage to the second percentage). If the second percentage exceeds the first percentage beyond a threshold, the method reallocates a propelling power from the battery for the HEV in order to reduce the usage of the battery. One approach to reduce the usage of the battery is to derate a power limit of the battery available to propel the HEV. The power limit can be derated by the same proportion as the difference. For example, if the second percentage indicative of the actual usage exceeds the first percentage indicative of the age usage by 10%, the power limit is derated by 10%. Another approach is to stop use of the battery in operations that have low efficiency or benefit per certain amount of battery usage. For example, the drive-train supplement will be stopped from using the battery while the start/stop operations will be allowed. In this manner, the method guides a battery power allocation that could help meet the target life expectancy of the battery.

The methods, systems, and apparatus disclosed herein may be used in various HEVs, such as light duty HEVs (e.g., a sedan, golf cart, wheel chair, forklift) and heavy-duty vehicles (e.g., a front-end loader). Based on the type of HEV, a wide range of battery(ies) may be utilized with the HEV, such as high-voltage lithium-ion, lead-acid, lithium-polymer, and/or nickel metal hydride (NiMH) battery.

Figure 1:
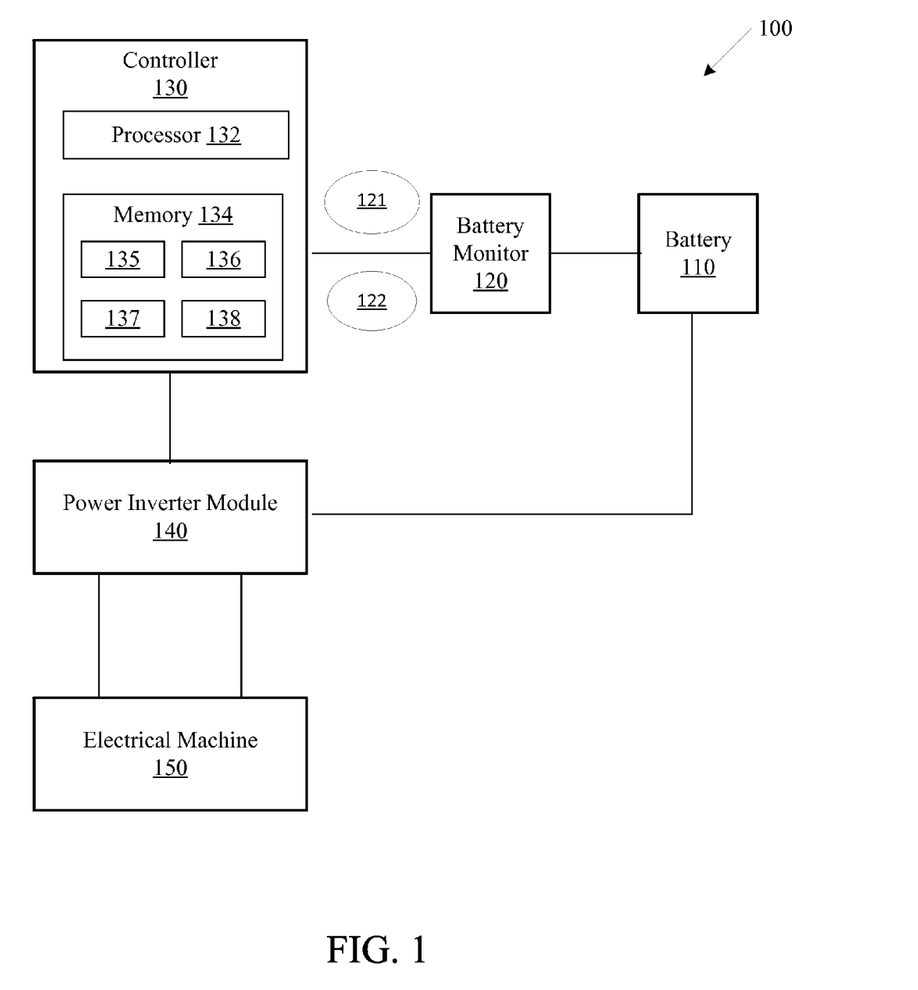
FIG. 1 is a schematic view of a HEV with a controller managing a battery according to an example embodiment.

Referring now to FIG. 1, a HEV 100 is shown with a battery 110, a battery monitor 120, a controller, a power inverter module ("PIM") 140, and an electrical machine 150. For ease of explaining, other vehicle components (e.g., a transmission and an engine) are omitted in the Figure. In order to meet the power requirements of the HEV, more than one battery 110 may be coupled together (e.g., in series) to increase the available voltage (and power) from the batteries.

The battery monitor 120 is coupled with the battery 110 and acquires data regarding the battery 110. The data may include age data 121 and usage data 122 of the battery. The age data 121 is indicative of a current age of the battery 110, for example, a period of time that the battery 110 has been used with the HEV 100 since the battery 110 began use in the HEV 100, or a distance that the battery 110 has travelled with the HEV 100, or a combination of both. The time of usage may be measured by, for example, a timer. The distance of usage may be measured by, for example, a distance sensor. The usage data 122 is indicative of a current usage of the battery, for example, a current cumulative throughput of the battery, or a current state of health (SOH) of the battery, or a combination of both. As used herein, the phrase "cumulative throughput" refers to the total energy that has been delivered or stored by the battery. For example, the cumulative throughput may be expressed as an ampere-hour (Ah) throughput representing the total current passing through the battery over time. The cumulative throughput may be acquired, for example, by measuring the current into and/or out of the battery 110 with a current sensor and an integrator for integrating the current with respect to time. Also as used herein, the phrase "SOH" refers to the battery's ability to store and deliver electrical energy. For example, the SOH may be expressed as an amount of charge a battery can hold, or a percentage in relation to an original amount of charge capacity of the battery, or an ohmic resistance of the battery. The SOH may be acquired, for example, by measuring the voltage of the battery 110 as fully charged with a voltage sensor, or by measuring the resistance of the battery 110 with an ohmmeter. Besides the age data 121 and the usage data 122, the battery monitor 120 may also acquire other data, for example, temperature of the battery. The battery monitor 120 may be implemented to include one or more sensors coupled to the battery 110 that acquires such data. The sensors may include a timer, a distance sensor, a current sensor, a voltage sensor, and appropriate circuits.

The controller 130 obtains the age data 121 and the usage data 122 from the battery monitor 120. Communication between the controller 130 and the battery monitor 120 may be via any number of wired or wireless connections. For example, a wired connection may include a serial cable, a fiber optic cable, a CAT5 cable, or any other form of wired connection. In comparison, a wireless connection may include the Internet, Wi-Fi, cellular, radio, etc. In one embodiment, a controller area network (CAN) bus provides the exchange of signals, information, and/or data. The CAN bus includes any number of wired and wireless connections. The controller 130 is structured to receive age data 121 and usage data 122 from battery monitor 120.

The controller 130 is shown to include a processor 132 and a memory 134. The processor 132 may be implemented as a general-purpose processor, an application specific integrated circuit (ASIC), one or more field programmable gate arrays (FPGAs), a digital signal processor (DSP), a group of processing components, or other suitable electronic processing components. The one or more memory devices 134 (e.g., RAM, ROM, Flash Memory, hard disk storage, etc.) may store data and/or computer code for facilitating the various processes described herein. Thus, the one or more memory devices 134 may be communicably connected to the processor 132 and provide computer code or instructions to the processor 132 for executing the processes described in regard to the controller 130 herein. Moreover, the one or more memory devices 134 may be or include tangible, non-transient volatile memory or non-volatile memory. Accordingly, the one or more memory devices 134 may include database components, object code components, script components, or any other type of information structure for supporting the various activities and information structures described herein.

The memory 134 is shown to include various modules for completing the activities described herein. More particularly, the memory 134 includes an age data module 135, a usage data module 136, a comparison module 137, and an allocation module 138. The age data module 135 is structured to interpret the age data 121. In some embodiments, the age data module 135 includes timer/distance sensor for acquiring age data 121. In other embodiments, the age data module 135 includes a communication circuitry configured for establishing a communication session between the age data module 135 and the battery monitor 120, such that the age data module 135 may receive age data 121 from the battery monitor 120. The usage data module 136 is structured to interpret the usage data 122. In some embodiments, the usage data module 136 includes voltage sensor/ohmmeter for acquiring usage data 122. In other embodiments, the usage data module 136 includes a communication circuitry configured for establishing a communication session between the usage data module 136 and the battery monitor 120, such that the usage data module 136 may receive usage data 122 from the battery monitor 120. The comparison module 137 is structured to compare the age data to the usage data 122. In some embodiment, the comparison module 137 includes a circuitry configured for comparing the age data 121 to the usage data 122. In other embodiments, the comparison module 137 includes instruction stored in computer-readable medium. The allocation module 138 is structured to allocate a propelling power from the battery 110 to the HEV 100 responsive to the comparison. In some embodiments, the allocation module 138 includes communication circuitry configured for establishing a communication session between the allocation module 138 and the power inverter module 140, such that the power inverter module 140 may receive control signal from the allocation module 138. It should be understood that the controller 130 and memory 134 may include any number of modules for completing the functions described herein. For example, the activities of multiple modules may be combined as a single module, as additional modules with additional functionality may be included, etc. Further, it should be understood that the controller 130 may further control other vehicle activity beyond the scope of the present disclosure.

Certain operations of the controller 130 described herein include operations to interpret and/or to determine one or more parameters. Interpreting or determining, as utilized herein, includes receiving values by any method known in the art, including at least receiving values from a datalink or network communication, receiving an electronic signal (e.g. a voltage, frequency, current, or PWM signal) indicative of the value, receiving a computer generated parameter indicative of the value, reading the value from a memory location on a non-transient computer readable storage medium, receiving the value as a run-time parameter by any means known in the art, and/or by receiving a value by which the interpreted parameter can be calculated, and/or by referencing a default value that is interpreted to be the parameter value.

The power inverter module 140 is coupled with the battery 110, the controller 130, and one or more electrical machines 150. The power inverter module 140 transfers electrical energy from the battery 110 to the electrical machine 150 based on the power allocation configuration received from the controller 130. The power inverter module 140 may include power inverters that invert direct current (DC) to alternating current (AC) and motor controller that controls/drives the electrical machines 150. The power inverter module 140 may implemented as an integrated vehicle control module (IVCM). The electrical machines 150 may comprise motors/generator devices, such as three-phase motors.

In the example of FIG. 1, the controller 130 is separate from the power inverter module 140. However, in some embodiments, the functions described herein in regard to the controller 130 may be performed by one or more existing processors in the power inverter module 140.

Figure 2:
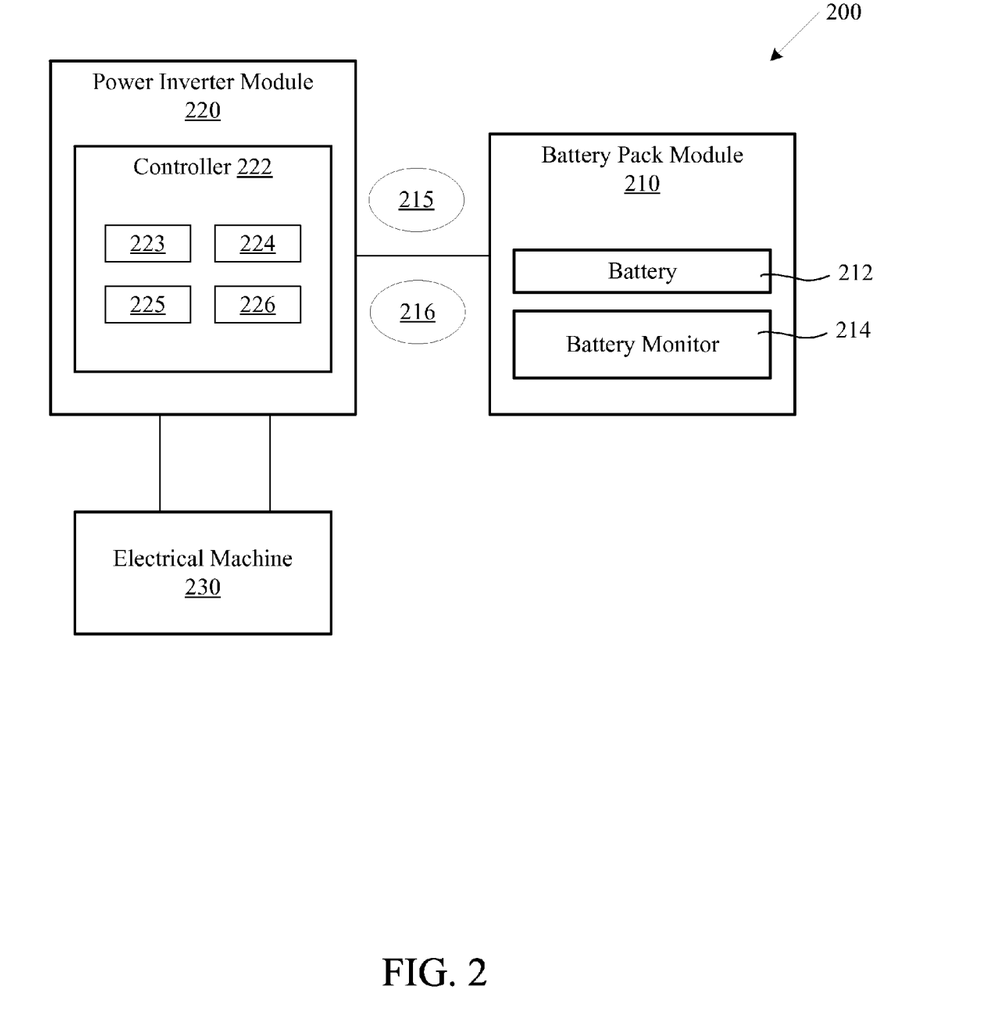
FIG. 2 is a schematic view of a HEV with a controller managing a battery according to another example embodiment.

Referring to FIG. 2, a HEV 200 with a controller 222 within a power inverter module 220 is shown. The HEV 200 includes a battery pack module 210, the power inverter module 220, and one or more electrical machines 230. For ease of explaining, other vehicle components (e.g., a transmission and an engine) are omitted in the Figure. The HEV 200 may be various kinds of HEVs. The battery pack module includes a battery 212 and a battery monitor 214. The battery 212 is similar to the battery 110 in FIG. 1, which may be a wide range of batteries, such as high-voltage lithium-ion, lead-acid, lithium-polymer, and/or nickel metal hydride (NiMH) battery. The battery 212 may include multiple batteries coupled together to meet the power requirements of the HEV. The battery monitor 214 is similar to the battery monitor 120 in FIG. 1, which acquires data regarding the battery 212. The battery monitor 214 may include a timer which measures an amount of time the battery 212 has been used with the HEV 200, a distance sensor which measures a distance the battery 212 has traveled with the HEV 200, a current sensor and an integrator which measure a cumulative throughput of the battery 212, and a voltage sensor or an ohmmeter which measure a SOH of the battery 212. The battery monitor 214 may include other sensors for acquiring other data of the battery 212, for example, a temperature sensor which measures a temperature of the battery 212.

Power inverter module 220 is coupled with the battery pack module 210 and the electrical machine 230 and receives the age data 215 and the usage data 215 from the battery pack module 210. Power inverter module 220 includes the controller 222 that performs similar function as the controller 130 in FIG. 1 and that includes similar modules 223, 224, 225, and 226 as modules 135, 136, 137, and 138 in FIG. 1. However, the controller 222 is implemented on one or more existing processor of the power inverter module 220, for example, a general-purpose processor, an application specific integrated circuit (ASIC), one or more field programmable gate arrays (FPGAs), a digital signal processor (DSP), a group of processing components, or other suitable electronic processing components. Moreover, the controller 222 utilizes one or more existing communication connections and memory devices of the power inverter module 220. The one or more electrical machines 230 is similar to the electrical machine 150 in FIG. 1 and may comprises motors/generator devices, such as three-phase motors.

Figure 3:
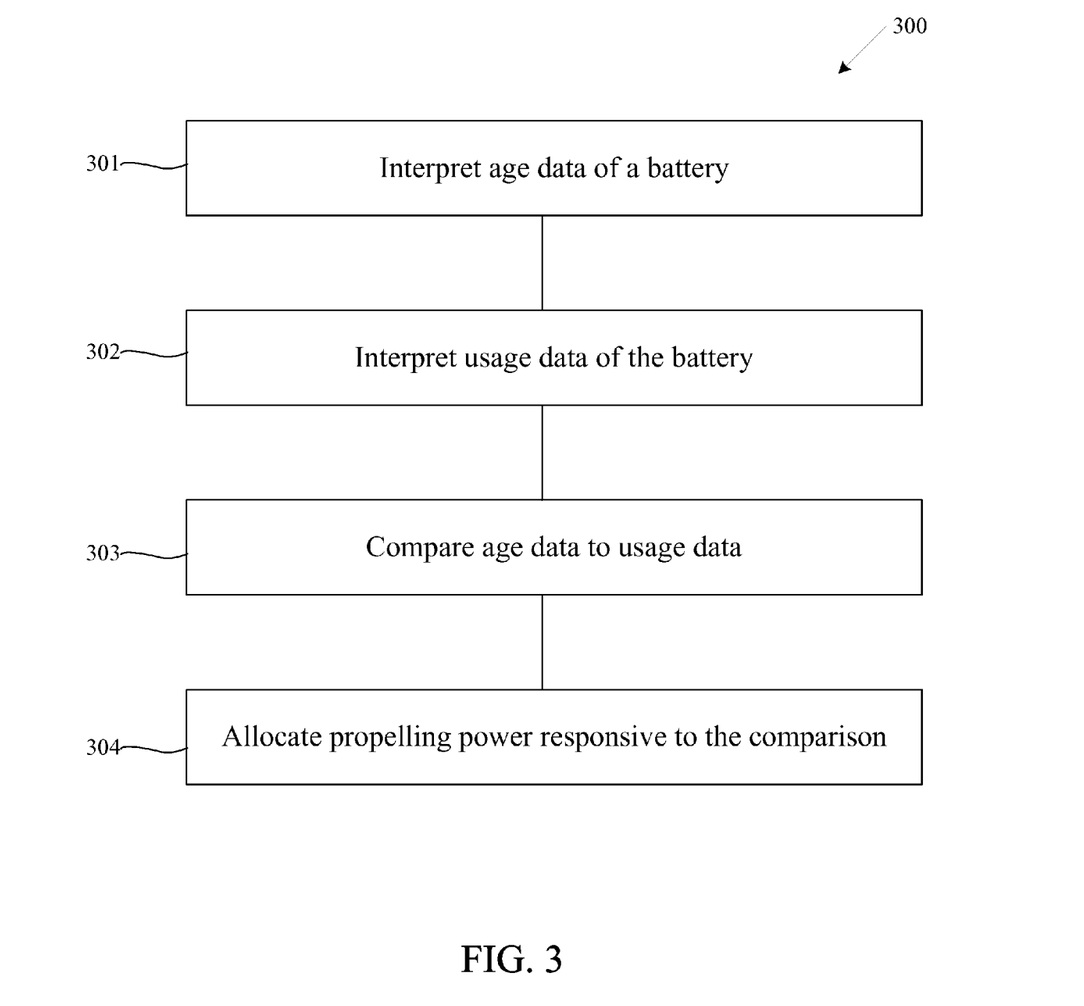
FIG. 3 is a flow chart of a method of managing lifespan of a battery according to an example embodiment.

Referring to FIG. 3, a method 300 of managing the lifespan of a battery of a HEV is shown according to an embodiments. In certain embodiments, method 300 is implemented with the controller 130 or 222 described herein. Accordingly, method 300 is applicable with the various embodiments shown in FIGS. 1 and 2. For example, method 300 may be embodied as machine-readable instructions that are executable by a processor 132 of the system 130 (in an alternate embodiment, by one or more processors of the power inverter module 220).

At operation 301, age data of a battery is interpreted. The age data is indicative of a current age of a battery of a HEV and may be acquired by the battery monitor. The age data may be interpreted by the age data module 135 or 223. The first data may include a period of time that the battery has been used with the HEV since the battery began use in the HEV, or a distance that the battery has travelled with the HEV, or a combination of both. The period of time of usage may be measured by a timer. The distance of usage may be measured by a distance sensor.

At operation 302, usage data of the battery is interpreted. The usage data is indicative of a current usage of the battery of the HEV and may be acquired by the battery monitor. The usage data may be interpreted by the usage data module 136 or 234. The usage data may include a current cumulative throughput of the battery, or a current state of health (SOH) of the battery, or a combination of both. The current cumulative throughput indicates the amount of total energy that has been delivered or stored by the battery. For example, the cumulative throughput may be expressed as an ampere-hour (Ah) throughput representing the total current passing through the battery over time. The SOH indicates the battery's ability to store and deliver electrical energy. The SOH may be expressed as an amount of charge a battery can hold, or a percentage in relation to an original amount of charge capacity of the battery, or an ohmic resistance of the battery. The current cumulative throughput may be acquired by a sensor that measures the current into and out of the battery and an integrator that integrates the current with respect to time. The SOH may be acquired by measuring a voltage of the battery as fully charged with a voltage sensor or by measuring an ohmic resistance of the battery with an ohmmeter.

At operation 303, the age data is compared to the usage data. In some embodiments, the comparison determines a first percentage of the current age in a target life expectancy of the battery. The target life expectancy may be specified in a manufacturer's warranty in terms of, for example, a period of time since the battery began use in the HEV and/or a mileage that the battery has travelled with the HEV before the battery fails to satisfy specific performance criteria. The first percentage represents a percentage of warranty period that has expired. The comparison also determines a second percentage of the current usage in a target end-of-life total usage of the battery. The target end-of-life total usage may be an end-of-life total throughput or an end-of-life SOH specified in a battery specification. When a current SOH and an expected end-of-life SOH is used, a look-up table may be used to determine where the current SOH is relative to the end-of-life SOH. The comparison then compares the first percentage to the second percentage, for example, determines a difference or a ratio of the first percentage to the second percentage.

At operation 304, a propelling power for the HEV from the battery is allocated based on the comparison at the operation 303. If the second percentage is smaller than or equal to the first percentage, this indicates that the actual battery usage is lower than or equal to the expected usage. The propelling power is not reallocated but kept at a current level. If the second percentage is bigger than the first percentage, this indicates that the actual battery usage is higher than expected, predicating a premature end-of-life. A reallocation of propelling power is made accordingly. In some embodiments, a small exceedance is tolerated. For example, when the second percentage exceeds the first percentage by a threshold percentage will the propelling power be relocated. The threshold percentage may be for example, 2%, 5%, 10%, or other appropriate percentages.

One way to regulate battery usage is to derate a power limit of the battery available to propel the HEV. In a HEV with a parallel architecture, propelling power is allocated between the battery and an internal combustion engine. The propelling power allocated to the battery may vary from zero to the power limit of the battery. By derating the power limit, the usage of the battery is reduced. In some embodiments, the power limit is derated by the same proportion as the difference of the second percentage (i.e., the usage percentage) from the first percentage (i.e., the age percentage). For example, if the second percentage exceeds the first percentage by 10%, the power limit is derated by 10%. In other embodiments, the power limit is derated by a different proportion if it is appropriate for the battery.

Another way to regulate battery usage is to stop use of the battery for certain operations. Different operations of the HEV have different efficiency and benefit per certain amount of battery usage. For example, the drive-train supplement operation has low efficiency and benefit per certain amount of battery usage, while the start/stop operation has high efficiency and benefit. When the actual usage percentage exceeds the first percentage, the operations with lower efficiency and benefits are stopped from using the battery. For example, the drive-train supplement will be stopped from using the battery while the start/stop operations will be allowed.

In some embodiments, in the first three months of time or an equivalent initial driving distance, the battery usage is not regulated so that a reliable trend for the cumulative actual usage trend can be established. Battery usage may then be regulated based on the data collected during this period of time. In this way, it allows the trend to stabilize at the beginning of the life before regulating battery usage.

It should be noted that the term "example" as used herein to describe various embodiments is intended to indicate that such embodiments are possible examples, representations, and/or illustrations of possible embodiments (and such term is not intended to connote that such embodiments are necessarily extraordinary or superlative examples).

Example and non-limiting module implementation elements include sensors providing any value determined herein, sensors providing any value that is a precursor to a value determined herein, datalink and/or network hardware including communication chips, oscillating crystals, communication links, cables, twisted pair wiring, coaxial wiring, shielded wiring, transmitters, receivers, and/or transceivers, logic circuits, hard-wired logic circuits, reconfigurable logic circuits in a particular non-transient state configured according to the module specification, any actuator including at least an electrical, hydraulic, or pneumatic actuator, a solenoid, an op-amp, analog control elements (springs, filters, integrators, adders, dividers, gain elements), and/or digital control elements.

The schematic flow chart diagrams and method schematic diagrams described above are generally set forth as logical flow chart diagrams. As such, the depicted order and labeled steps are indicative of representative embodiments. Other steps, orderings and methods may be conceived that are equivalent in function, logic, or effect to one or more steps, or portions thereof, of the methods illustrated in the schematic diagrams.

Additionally, the format and symbols employed are provided to explain the logical steps of the schematic diagrams and are understood not to limit the scope of the methods illustrated by the diagrams. Although various arrow types and line types may be employed in the schematic diagrams, they are understood not to limit the scope of the corresponding methods. Indeed, some arrows or other connectors may be used to indicate only the logical flow of a method. For instance, an arrow may indicate a waiting or monitoring period of unspecified duration between enumerated steps of a depicted method. Additionally, the order in which a particular method occurs may or may not strictly adhere to the order of the corresponding steps shown. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in machine-readable medium for execution by various types of processors. An identified module of executable code may, for instance, comprise one or more physical or logical blocks of computer instructions, which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of computer readable program code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in machine-readable medium (or computer-readable medium), the computer readable program code may be stored and/or propagated on in one or more computer readable medium(s).

The computer readable medium may be a tangible computer readable storage medium storing the computer readable program code. The computer readable storage medium may be, for example, but not limited to, an electronic, magnetic, optical, electromagnetic, infrared, holographic, micromechanical, or semiconductor system, apparatus, or device, or any suitable combination of the foregoing.

More specific examples of the computer readable medium may include but are not limited to a portable computer diskette, a hard disk, a random access memory (RAM), a read-only memory (ROM), an erasable programmable read-only memory (EPROM or Flash memory), a portable compact disc read-only memory (CD-ROM), a digital versatile disc (DVD), an optical storage device, a magnetic storage device, a holographic storage medium, a micromechanical storage device, or any suitable combination of the foregoing. In the context of this document, a computer readable storage medium may be any tangible medium that can contain, and/or store computer readable program code for use by and/or in connection with an instruction execution system, apparatus, or device.

The computer readable medium may also be a computer readable signal medium. A computer readable signal medium may include a propagated data signal with computer readable program code embodied therein, for example, in baseband or as part of a carrier wave. Such a propagated signal may take any of a variety of forms, including, but not limited to, electrical, electro-magnetic, magnetic, optical, or any suitable combination thereof. A computer readable signal medium may be any computer readable medium that is not a computer readable storage medium and that can communicate, propagate, or transport computer readable program code for use by or in connection with an instruction execution system, apparatus, or device. Computer readable program code embodied on a computer readable signal medium may be transmitted using any appropriate medium, including but not limited to wireless, wireline, optical fiber cable, Radio Frequency (RF), or the like, or any suitable combination of the foregoing In one embodiment, the computer readable medium may comprise a combination of one or more computer readable storage mediums and one or more computer readable signal mediums. For example, computer readable program code may be both propagated as an electro-magnetic signal through a fiber optic cable for execution by a processor and stored on RAM storage device for execution by the processor.

Computer readable program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The computer readable program code may execute entirely on the user's computer, partly on the user's computer, as a stand-alone computer-readable package, partly on the user's computer and partly on a remote computer or entirely on the remote computer or server.

The program code may also be stored in a computer readable medium that can direct a computer, other programmable data processing apparatus, or other devices to function in a particular manner, such that the instructions stored in the computer readable medium produce an article of manufacture including instructions which implement the function/act specified in the schematic flowchart diagrams and/or schematic block diagrams block or blocks.

Accordingly, the present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. An apparatus, comprising:
an age data module structured to interpret age data indicative of a current age of a battery, the age data including a period of time since the battery began to be used in a vehicle;
a usage data module structured to interpret usage data indicative of a current usage of the battery;
a comparison module structured to compare the age data to the usage data, the comparison including:
determining a first data indicative of a first estimate of remaining life of the battery based on the current age of the battery;
determining a second data indicative of a second estimate of remaining life of the battery based on the current usage of the battery; and
comparing the first data to the second data; and
an allocation module structured to allocate a propelling power from the battery to control an electrical machine of the vehicle responsive to the comparison, wherein responsive to the first data being greater than or equal to the second data, maintaining an amount of propelling power from the battery to control the electrical machine, and wherein responsive to the second data being greater than the first data, reducing an amount of propelling power from the battery to control the electrical machine.

2. The apparatus of claim 1, wherein the age data further includes an indication of a distance that the battery has travelled with the vehicle.

3. The apparatus of claim 1, wherein the usage data includes a current cumulative throughput of the battery.

4. The apparatus of claim 1, wherein the usage data includes a current state of health (SOH) of the battery.

5. The apparatus of claim 1, wherein the allocation module is further structured to derate a power limit of the battery available to propel the vehicle responsive to a determination that the second data exceeds the first data beyond a threshold.

6. The apparatus of claim 1, wherein the allocation module is further structured to stop use of the battery in operations that consume battery life quickly responsive to a determination that the second data exceeds the first data beyond a threshold.

7. The apparatus of claim 1, further comprising a collection module structured to collect the age data and the usage data for a period of time, wherein during the period of time, operation of the vehicle is free of regulation of usage of the battery.

8. The apparatus of claim 1, wherein the vehicle is a hybrid electric vehicle (HEV).

9. A system, comprising:
a battery;
a battery monitor coupled to the battery; and
a controller communicably coupled to the battery and the battery monitor, the controller structured to:
interpret age data indicative of a current age of the battery received from the battery monitor to determine a first data indicative of a first estimate of remaining life of the battery, the age data including a period of time since the battery began to be used in a vehicle;
interpret usage data indicative of a current usage of the battery received from the battery monitor to determine a second data indicative of a second estimate of remaining life of the battery;
compare the age data to the usage data; and
allocate a propelling power from the battery to power an electrical machine of the vehicle responsive to the comparison, wherein responsive to the first data being greater than or equal to the second data, maintaining an amount of propelling power from the battery to control the electrical machine, and wherein responsive to the second data being greater than the first data, reducing an amount of propelling power from the battery to control the electrical machine.

10. The system of claim 9, wherein the controller is further structured to:

derate a power limit of the battery available to propel the vehicle responsive to a determination that the second data exceeds the first data beyond a threshold.

11. The system of claim 9, wherein the controller is further structured to:
stop use of the battery in operations that consume battery life quickly responsive to a determination that the second data exceeds the first data beyond a threshold.

12. The system of claim 9, wherein the controller is further structured to:
collect the age data and the usage data for a period of time, wherein during the period of time, operation of the vehicle is free of regulation of usage of the battery.

13. A method comprising:
interpreting age data indicative of a current age of a battery, to determine a first data indicative of a first estimate of remaining life of the battery, the age data including a period of time since the battery began to be used in a vehicle;
interpreting usage data indicative of a current usage of the battery to determine a second data indicative of a second estimate of remaining life of the battery;
comparing the age data to the usage data; and
allocating a propelling power from the battery to power an electrical machine of the vehicle responsive to the comparison, wherein responsive to the first data being greater than or equal to the second data, maintaining an amount of propelling power from the battery to control the electrical machine, and wherein responsive to the second data being greater than the first data, reducing an amount of propelling power from the battery to control the electrical machine.

14. The method of claim 13, wherein said allocating the propelling power from the battery in the vehicle responsive to the comparison includes:
re-allocating the propelling power if the second data exceeds the first data beyond a threshold; and
maintaining a current allocation of the propelling power if the second data does not exceeds the first data beyond the threshold.

15. The method of claim 13, wherein said allocating the propelling power includes:
derating a power limit of the battery available to propel the vehicle responsive to a determination that the second data exceeds the first data beyond a threshold.

16. The method of claim 13, wherein said allocating the propelling power includes:
stopping use of the battery in operations that consume battery life quickly responsive to a determination that the second data exceeds the first data beyond a threshold.

17. The method of claim 13, further comprising:
collecting the age data and the usage data for a period of time, wherein during the period of time, operation of the vehicle is free of regulation of usage of the battery.

* * * * *